United States Patent [19]

Hine et al.

[11] Patent Number: 4,611,223
[45] Date of Patent: Sep. 9, 1986

[54] SOLID-STATE IMAGE SENSOR AND MANUFACTURING PROCESS THEREOF

[75] Inventors: Shiro Hine, Minoo; Hidenobu Ishikura, Itami, both of Japan

[73] Assignee: Mitsubishi Denki Kabushiki Kaisha, Tokyo, Japan

[21] Appl. No.: 526,402

[22] Filed: Aug. 25, 1983

[30] Foreign Application Priority Data

Oct. 25, 1982 [JP] Japan .................... 57-188552

[51] Int. Cl.⁴ .................... H01L 27/14; H01L 29/78
[52] U.S. Cl. .................... 357/30; 357/24; 357/32; 357/45; 357/47; 358/213; 358/241
[58] Field of Search .................... 357/30, 31, 32, 45, 357/41, 24 LR, 49, 47; 358/213, 241

[56] References Cited

FOREIGN PATENT DOCUMENTS 0040984 12/1981 European Pat. Off. .......... 357/30

OTHER PUBLICATIONS

Hune et al.–A New Isolation Technology for Bipolar Devices by Low Pressure Selective Silicon Epitaxy–Mitsubishi Elec. Corp., Japan.
Endo et al.–Novel Device Isolation Technology with Selective Epitaxy Growth–Nippon Elec. Co., Japan–IEDM 1982.

Primary Examiner—James W. Davie
Assistant Examiner—Georgia Y. Epps
Attorney, Agent, or Firm—Lowe Price Leblanc Becker & Shur

[57] ABSTRACT

A solid-state image sensor comprises an n-type silicon substrate (11), a p-type silicon layer (12) formed on the substrate (11), a plurality of nMOS transistors (1), a field insulating film (13) for separating the nMOS transistors (1) and a buried insulating film (20) provided between the substrate (11) and the field insulating film (13). The buried insulating film (20) serve to prevent electrons from flowing between the adjacent nMOS transistors (1). Accordingly, occurrence of a color mixture phenomenon, a blooming phenomenon or a smear phenomenon can be suppressed. In addition, when a p-type junction layer (21) is provided on the substrate (11) and a bias power supply (19) is connected between them, and when the voltage is adjusted, the red color sensitivity of a photodiode consisting of an n-type source region (16) in each nMOS transistor (1) can be uniformly and easily adjusted.

20 Claims, 11 Drawing Figures

FIG.1

PRIOR ART

SOLID-STATE IMAGE SENSOR AND MANUFACTURING PROCESS THEREOF

BACKGROUND OF THE INVENTION

1. Field of the Invention

The present invention relates to a solid-state image sensor comprising a photoelectric transducing portion in which a plurality of photoelectric transducers are provided horizontally in a plurality of rows and vertically in a plurality of columns, respectively.

2. Description of The Prior Art

As a solid-state image sensor, a MOS type solid-state image sensor and a charge coupled device (CCD) type solid-state image sensor are known.

An example of a solid-state image sensor using n-channel MOS transistors (referred to hereinafter as "nMOS transistors") will be described in the following.

Figure 1:
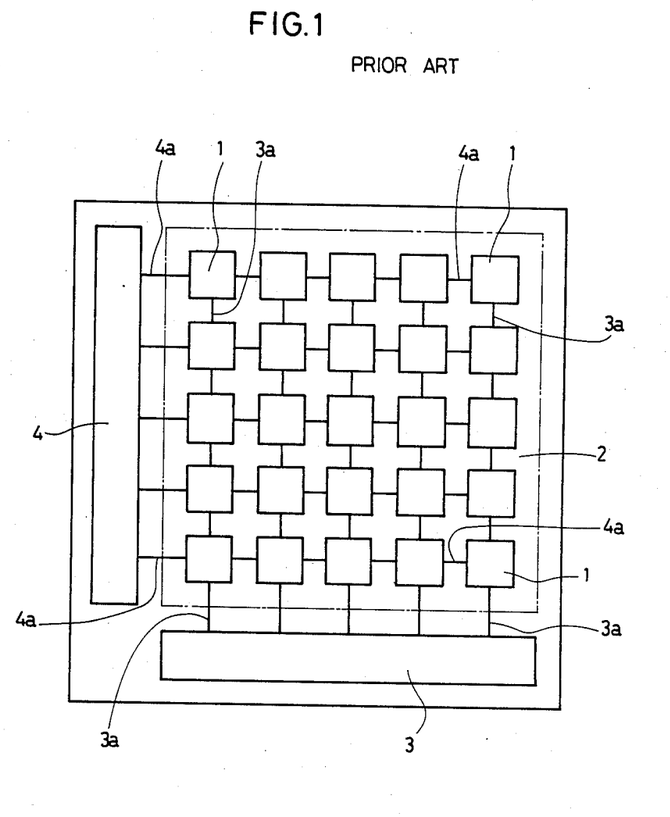
FIG. 1 is a plan view showing an example of a structure of a conventional nMOS type solid-state image sensor.

FIG. 1 is a plan view showing an example of the structure of a conventional nMOS type solid-state image sensor. This solid-state image sensor comprises: a plurality of nMOS transistors 1 serving as photoelectric transducers provided in a plurality of rows horizontally and in a plurality of columns vertically at distances from each other; a photoelectric transducing portion 2 shown by the dot-and-dash line comprising a plurality of nMOS transistors 1; a horizontal scanning circuit portion 3 provided at a distance from the photoelectric transducing portion 2, in parallel with the horizontal nMOS transistors 1, the horizontal scanning circuit portion 3 including a plurality of commonly connected lines (3a) of the first layer for successively connecting the plurality of nMOS transistors 1 in columns so as to successively scan the lines 3a; and a vertical scanning circuit portion 4 provided at a distance from the photoelectric transducing portion 2, in parallel with the vertical, nMOS transistors 1, the vertical scanning circuit portion 4 including a plurality of commonly connected lines 4a of the second layer for successively connecting the plurality of nMOS transistors 1 in rows so as to successively scan the lines 4a.

Figure 2:
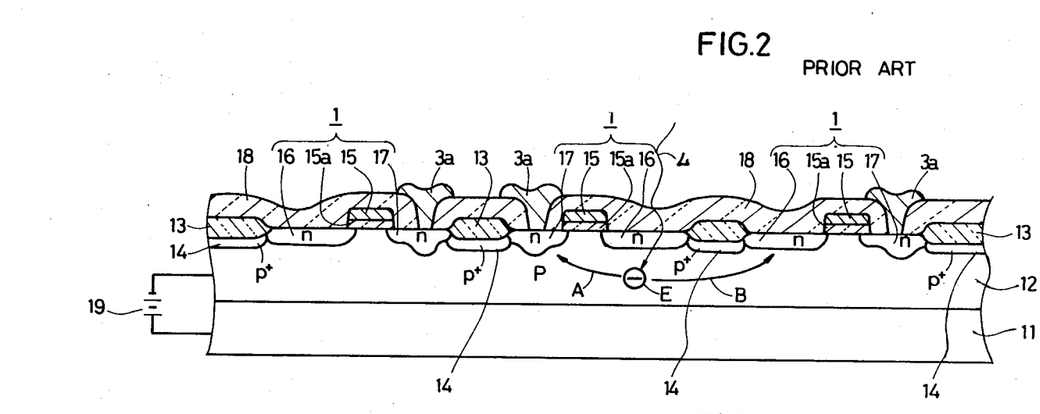
FIG. 2 is a sectional view showing a part of an array of nMOS transistors in rows in a step where lines of the first layer of a photoelectric transducing portion are formed in a conventional nMOS type solid-state image sensor.

FIG. 2 is a sectional view showing partially an array of nMOS transistors in rows in a step where lines of the first layer of a photoelectric transducing portion are formed in a conventional nMOS type solid-state image sensor. In FIG. 2, the same reference characters as in FIG. 1 indicate like parts. The nMOS transistor array in FIG. 2 comprises: an n-type silicon substrate 11; a p-type silicon layer 12 formed on one major surface of the n-type silicon substrate 11 by the epitaxial growth method; a field insulating film 13 formed on one major surface of the p-type silicon layer 12 so as to separate the respective regions assigned for nMOS transistors; p+ type channel cut regions 14 formed under the field insulating film 13 of the p-type silicon layer 12; nMOS transistors 1 formed by a well known nMOS transistor forming method in the respective nMOS transistor forming regions separated by the field insulating film 13 on the major surface of the p-type silicon layer 12; gate electrodes 15 formed through a gate insulating film 15a in fixed portions in the nMOS transistor forming regions on the major surface of the p-type silicon layer 12; and n-type source regions 16 and n-type drain regions 17 formed by introducing n-type impurity into both outer sides of each gate insulating film 15a of the nMOS transistor forming regions on the major surface of the p-type silicon layer 12. The n-type source regions 16 and the p-type silicon layer 12 in contact therewith constitute photodiodes for photoelectric transducing. The above described nMOS transistor array further comprises an insulating layer film 18 formed over all the upper surfaces of the nMOS transistors 1 and the field insulating film 13, and lines 3a of the first layer formed on the surface of the insulating film layer 18 and connected to the n-type drain regions 17 of the nMOS transistors 1 through openings provided in the insulating film layer 18. A bias power supply 19 for applying bias voltage in a reverse direction is connected between the n-type silicon substrate 11 and the p-type silicon layer 12.

In a conventional example having a structure as described above, when red color light is applied from a direction shown by an arrow L to an n-type source region 16 constituting a photodiode of an nMOS transistor 1, electrons (shown by a reference character E) are generated due to the red color light absorbed in a deep portion of the n-type source region 16 of the nMOS transistor 1. These electrons E flow into an n-type drain region 17 of the above mentioned nMOS transistor 1 through a path shown by an arrow A or flow into an n-type source region 16 of an nMOS transistor 1 adjacent to the above mentioned nMOS transistor 1 through a path shown by an arrow B under the field insulating film 13, irrespectively of turning on or off of the gate electrode 15 of the above mentioned nMOS transistor 1. In order to suppress the flow of electrons E through the path A or B as described above and to prevent the red color sensitivity of a photodiode consisting of an n-type source region 16 from being intensified due to the electrons E so as to relatively increase the blue color sensitivity, bias voltage in a reverse direction is applied between the n-type silicon substrate 11 and the p-type silicon layer 12 by means of the bias power supply 19 so that the electrons E are withdrawn toward the n-type silicon substrate 11. This is particularly effective, as is known, in suppressing occurrence of a color mixture phenomenon, a blooming phenomenon and a smear phenomenon caused by the electrons E flowing through the path A or B when an amount of light larger than the saturation amount is applied to a photodiode consisting of an n-type source region 16.

However, in order to make the electrons E hardly flow through the path A or B, it is necessary to increase the bias voltage in the reverse direction applied between the n-type silicon substrate 11 and the p-type silicon layer 12 and, if the bias voltage is increased, the red color sensitivity of a photodiode consisting of an n-type source region 16 is lowered more than needed. As a result, it is not easy to prevent occurrence of the color mixture phenomenon, the blooming phenomenon and the smear phenomenon.

SUMMARY OF THE INVENTION

The present invention is, in brief, a solid-state image sensor and a manufacturing process thereof, the solid-state image sensor comprising a semiconductor substrate, an epitaxial growth semiconductor layer formed on the semiconductor substrate, a plurality of photoelectric transducers formed in a surface of the epitaxial growth semiconductor layer, a field insulating film separating the photoelectric transducers etc. and a buried insulating film provided in a portion between the semiconductor substrate and the field insulating film.

When red color light is irradiated to a source region forming a photodiode of a photoelectric transducer, electrons are generated due to the red color light absorbed in a deep portion under the source region. If these electrons flow into the source region of a photoelectric transducer adjacent to the above mentioned photoelectric transducer, a color mixture phenomenon, a blooming phenomenon and a smear phenomenon will occur. However, in accordance with the present invention, the respective photoelectric transducers are separated by the field insulating film and the buried insulating film and, as a result, such flow of electrons between the adjacent photoelectric transducers can be avoided. Accordingly, it is ascertained that the color mixture phenomenon, the blooming phenomenon and the smear phenomenon hardly occur.

Therefore, a principal object of the present invention is to provide a solid-state image sensor in which electrons are prevented from flowing between the adjacent photoelectric transducers through a portion under a field insulating film so that a color mixture phenomenon, a blooming phenomenon and a smear phenomenon hardly occur.

A principal advantage of the present invention is that since a buried insulating film is provided between a field insulating film of an epitaxial growth semiconductor layer and a semiconductor substrate, electrons can be prevented from flowing between the adjacent photoelectric transducers through a portion under the above described field insulating film and thus the possibility of occurrence of a color mixture phenomenon, a blooming phenomenon and a smear phenomenon can be diminished.

Another advantage of the present invention is that it is not necessarily needed to apply a reverse bias voltage to a pn junction formed between a semiconductor substrate and an epitaxial growth layer.

A further advantage of the present invention is that it is not necessarily needed to make use of a withdrawing effect due to diffusion current in the above described pn junction.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 3:
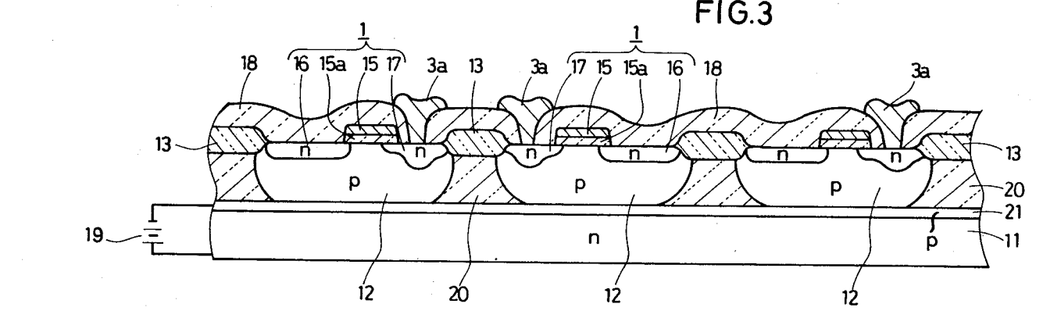
FIG. 3 is a sectional view showing a part of an array of nMOS transistors in rows in a step where lines of the first layer of a photoelectric transducing portion are formed in an nMOS type solid-state image sensor of the first embodiment of the present invention.

FIG. 3 is a sectional view showing partially an array of nMOS transistors in rows in a step where lines of the first layer are formed in a photoelectric transducing portion of an nMOS type solid-state image sensor of the first embodiment of the present invention. In FIG. 3, the same reference characters as in a conventional type shown in FIG. 2 indicate like parts. The array of nMOS transistors in FIG. 3 further comprises: a buried insulating film 20 provided in a p-type silicon layer 12 under a field insulating film 13 toward the surface of a p-type junction layer 21 described below, separating the adjacent nMOS transistors 1; and a p-type junction layer 21 formed on the major surface of the n-type silicon substrate 11, in contact with the p-type silicon layer 12 by an ion implantation or diffusion method, commonly connecting the respective regions of the silicon layer 12 separated by the field insulating film 13 and the buried insulating film 20. A bias power supply 19 is connected between the n-type silicon substrate 11 and the p-type junction layer 21. The structure in this embodiment is the same as that in the conventional type shown in FIG. 2 except for the buried insulating film 20 and the p-type junction layer 21.

In the structure of this embodiment, the respective nMOS transistors 1 are separated by the field insulating film 13 and the buried insulating film 20 and, accordingly, flow of electrons between the adjacent nMOS transistors as in the conventional type in FIG. 2 can be avoided, which effectively prevents occurrence of a color mixture phenomenon, a blooming phenomenon and a smear phenomenon. Furthermore, since the potential of each photodiode consisting of an n-type source region 16 in each nMOS transistor 1 can be made equal, the red color sensitivity of these photodiodes can be uniformly adjusted easily, by regulating the voltage of the bias power supply 19 applied between the p-type junction layer 21 and the n-type silicon substrate 11 so as to withdraw the electrons generated due to the infrared light absorbed in a deep portion under the photodiodes.

Figure 4A:
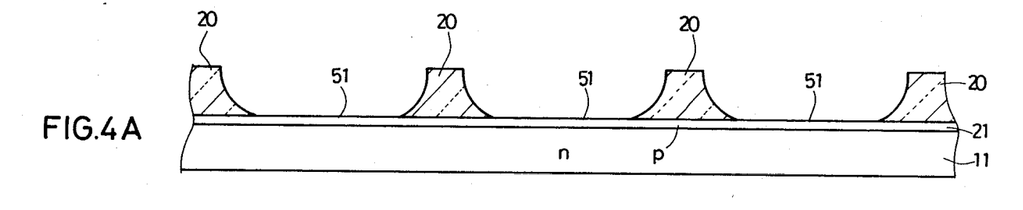
FIGS. 4A to 4C are sectional views showing states in major steps of the process of manufacturing a part of an nMOS transistor array in rows in a photoelectric transducing portion of the above mentioned first embodiment.
Figure 4B:
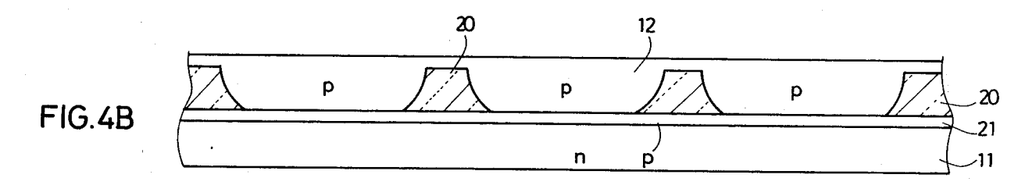
Figure 4C:
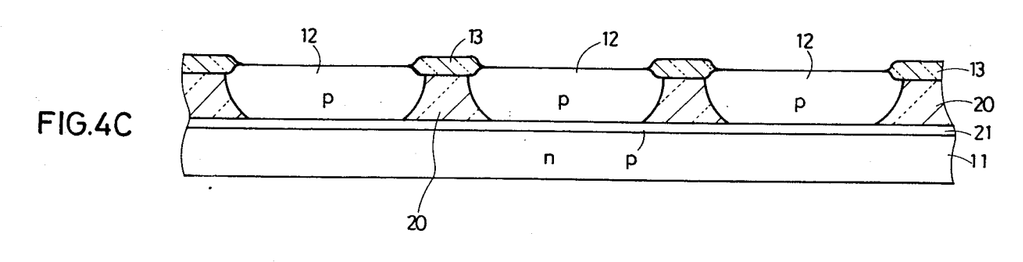

Next, the manufacturing process of this embodiment will be described with reference to sectional views in FIGS. 4A to 4C showing states in major steps. FIG. 4 represents only a portion corresponding to one part of an nMOS transistor array in rows in a photoelectric transducing portion of the present embodiment.

Figure 5:
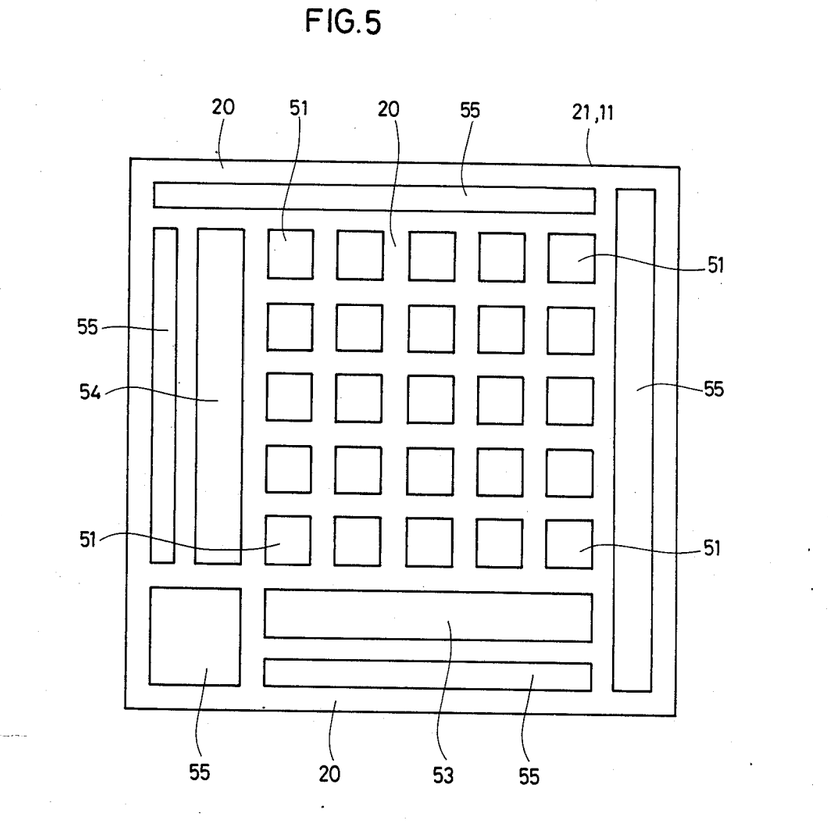
FIG. 5 is a plan view showing a state in a step where a buried insulating film of the above mentioned first embodiment is formed.

First, as shown in FIG. 4A, p-type impurity is introduced to the major surface of the n-type silicon substrate 11 by an ion implantation or diffusion method to form a p-type junction layer 21 and after that, an insulating film of silicon oxide, silicon nitride and the like having a thickness of approximately 0.1 to 1.5 μm for forming a buried insulating film is formed on the surface of the p-type junction layer 21. Then, by applying selective etching to this insulating film, a portion 51 corresponding to regions for forming nMOS transistors 1 in the photoelectric transducing portion 2, a portion 53 corresponding to a region for forming a horizontal scanning circuit portion 3, a portion 54 corresponding to a region for forming a vertical scanning circuit portion 4 and a portion 55 which corresponds to regions for forming monitor transistors etc. and is independent of the operation of the solid-state image sensor and is in the peripheries outside these portions 51, 52 and 54 (referred to hereinafter as "independent regions") (not shown in FIG. 1) are exposed on the surface of the p-type junction layer 21 and buried insulating film 20 having a width of approximately 50 to 100 μm remain, as shown in a plan view of FIG. 5. After that, as shown in FIG. 4B, by reducing the pressure in a vapor-phase epitaxy furnace to less than 100 Torr, a p-type silicon layer 12 thicker than the buried insulating film 20 is epitaxially grown over the exposed portions of the surface of the p-type junction layers 21 so that the buried insulating film 20 is covered with the p-type silicon layer 12. At this time, the surface of the p-type silicon layer 12 becomes smooth without irregularities, since it is made clear by an experiment carried out by the inventors of the present invention that abnormal epitaxial growth is not produced in the portions of the p-type silicon layer 12 in contact with the buried insulating film 20 when the pressure in a vapor-phase epitaxy furnace is less than 100 Torr and the width of a buried insulating film 20 is less than 100 μm. The p-type silicon layer 12 may be obtained by a method in which an n-type silicon layer of low impurity concentration or intrinsic silicon layer is epitaxially grown over the exposed portions of the surface of the p-type junction layer 21 and after that, p-type impurity is introduced into the layer by ion implantation or diffusion so that the layer is made to be of p type.

Next, a nitride film (not shown) is formed in the portions corresponding to the regions for forming nMOS transistors 1 in the surface of the p-type silicon layer 12 and using this nitride film as a mask, selective oxidation is applied so that the field insulating film 13 is formed in contact with the buried insulating film 20, as shown in FIG. 4C. Then, by a well known nMOS transistor forming technique, nMOS transistors 1 are formed in the regions assigned for nMOS transistors 1 and a insulating film layer 18 is formed over all the upper surfaces of these nMOS transistors and the field insulating films 13. After that, lines 3a of the first layer connected to the drain regions 17 of the nMOS transistors 1 through the layer insulating film are formed on the surface of the layer insulating film 18. Thus, the embodiment shown in FIG. 3 is realized.

Although a p-type junction layer 21 is formed on the major surface of the n-type silicon substrate 11 in the above described embodiment, it is not necessarily needed to form a p-type junction layer 21. Such a p-type junction layer 21 may be omitted.

Figure 6A:
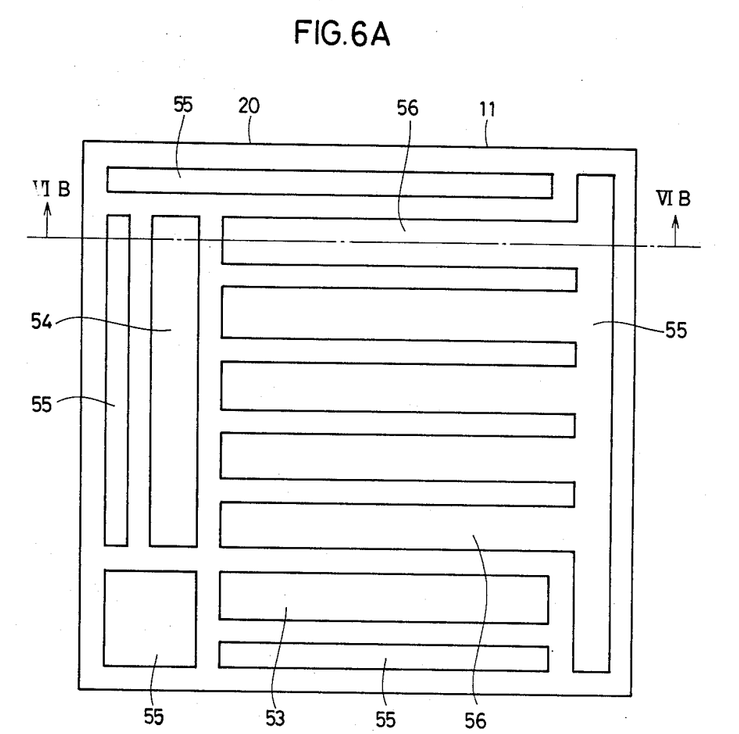
FIG. 6A is a plan view showing a state in a step where a buried insulating film of the second embodiment of the present invention is formed.
Figure 6B:
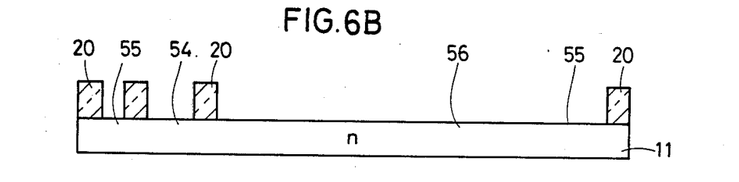
FIG. 6B is a sectional view taken along the line VIB—VIB in FIG. 6A.

FIG. 6A is a plan view showing a state in a step where a buried insulating film is formed without a p-type junction layer in accordance with the second embodiment of the present invention. FIG. 6B is a sectional view taken along the line VIB—VIB in FIG. 6A. In FIG. 6, the same reference characters as in FIGS. 2 to 5 indicate like parts.

In case of forming a buried insulating film of the second embodiment, in a step corresponding to the step shown in FIG. 4A, exposed portions corresponding to the regions for forming the respective nMOS transistors 1 in the nMOS transistor array in rows on the major surface of the n-type silicon substrate 11 are successively joined with each other and connected to exposed portions 55 corresponding to the adjacent independent regions so that exposed portions 56 in horizontal stripes are formed. Then, through not shown, in a step corresponding to the step shown in FIG. 4B, a p-type silicon layer 12 is formed on the exposed portions 53, 54, 55 and 56 of the major surface of the n-type silicon substrate 11 and in consequence the p-type silicon layer 12 in stripes corresponding to regions for forming nMOS transistor array in rows to be formed on the exposed major surface 56 in stripes become in a state integrally connected with the p-type silicon layer 12 in the independent regions to be formed on the exposed major surface 55 with which the exposed major surface 56 is connected. Thus, the p-type silicon layer 12 in the independent regions can perform the function of the p-type junction layer 21 in the first embodiment shown in FIG. 3. Accordingly, when a bias power supply 19 shown in FIG. 3 is connected between the p-type silicon layer 12 in the independent regions and the n-type silicon substrate 11, the potential of the photodiodes respectively consisting of an n-type source region 16 in the nMOS transistors 1 in the array in rows formed in the major surfaces of the p-type silicon layer 12 in stripes can be made equal.

In the above described second embodiment, electron flow between the adjacent nMOS transistors in an array in rows cannot be prevented, but electron flow between the adjacent nMOS transistors 1 in an array in columns can be prevented. As a result, compared with the case of a conventional type shown in FIG. 2, the color mixture phenomenon, the blooming phenomenon and the smear phenomenon are less likely to occur and in addition, by adjustment of the bias power supply 19, the red color sensitivity of each photodiode consisting of an n-type source region 16 in the nMOS transistors 1 can be adjusted equally.

Figure 7:
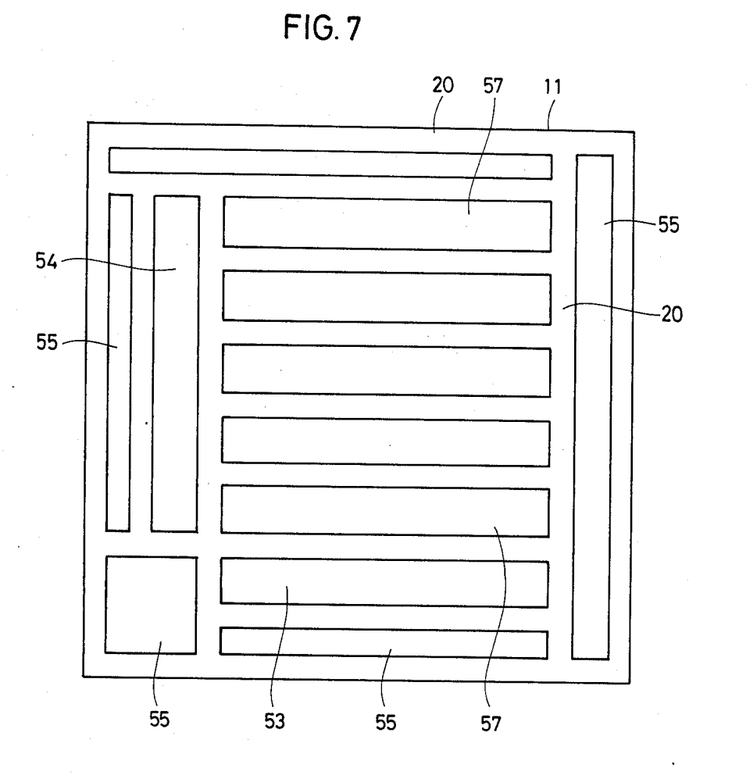
FIG. 7 is a plan view showing a state in a step where a buried insulating film of the third embodiment of the present invention is formed.

FIG. 7 is a plan view showing a state in a step where a buried insulating film is formed without a p-type junction layer in the third embodiment of the present invention. In FIG. 7, the same reference characters as in FIGS. 2 to 6 indicate like parts.

In the third embodiment, exposed portions corresponding to the regions for forming the nMOS transistors 1 in an array in rows on the major surface of the n-type silicon substrate 11 are joined with each other to form exposed portions 57 in horizontal stripes, which are separated by the exposed portions 55 corresponding to the adjacent independent regions and the buried insulating film 20. However, the p-type silicon layer 12 in stripes corresponding to the regions assigned for the nMOS transistor array in rows formed on the exposed major surface 57 in stripes of the n-type silicon substrate 11 in a step corresponding to the step shown in FIG. 4B is connected with the p-type silicon layer 12 in the independent regions formed on the exposed major surface 55 adjacent to the exposed major surface 57 in the subsequent steps, using an evaporated metallic film and, as a result, the same function as in the second embodiment shown in FIG. 6 can be performed also in the third embodiment.

In the above described second and third embodiments, the exposed portions 56 and 57 of the major surface of the n-type silicon substrate 11 are in the shape of horizontal stripes corresponding to the nMOS transistor array in rows, but such shape is not given in a limited sense. Even if they are in the shape of vertical stripes corresponding to an array in columns or in an irregular shape combining horizontal stripes and vertical stripes, the same function as in the above described second and third embodiment can be performed.

Figure 8:
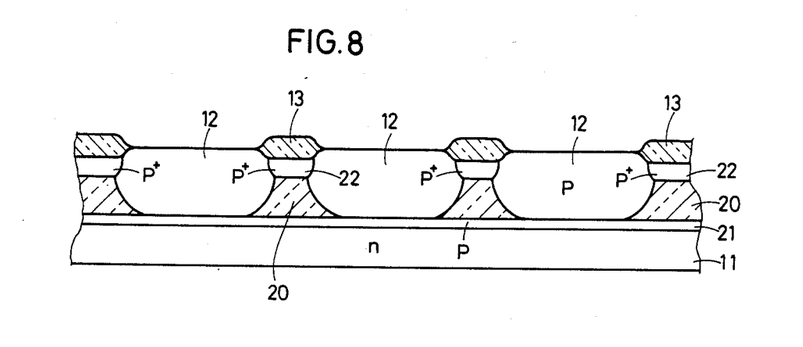
FIG. 8 is a sectional view showing a part of an array of nMOS transistors in rows in a step where a field insulating film is formed in a photoelectric transducing portion of the fourth embodiment of the present invention.

FIG. 8 is a sectional view showing partially an array of nMOS transistors in rows in a step where a field insulating film of a photoelectric transducing portion is formed in the fourth embodiment of the present invention. In FIG. 8, the same reference characters as in FIGS. 2 and 4 indicate like parts. This array of nMOS transistors further comprises a p+ separation layer 22 of p+ type single crystal silicon of high impurity concentration or p+ type polycrystal silicon formed between the field insulating film 13 and the buried insulating film 20 for the purpose of separating more completely the adjacent nMOS transistors 1.

At the time of manufacturing a sensor of the first embodiment shown in FIG. 3, it might happen that the p-type silicon layer 12 formed in the step shown in FIG. 4B becomes too thick and the field insulating film 13 formed in upper portions of the p-type silicon layer 12 cannot be brought in contact with the buried insulating film 20 in the step shown in FIG. 4C, causing a part of the p-type silicon layer 12 to remain between a field insulating film 13 and a buried insulating film 20. Since a portion of the p-type silicon layer 12 formed over a buried insulating film 20 is liable to become polycrystal silicon if the buried insulating film 20 is a silicon nitride film, the adjacent nMOS transistors can be separated. However, if the buried insulating film 20 is a silicon oxide film, the above described portion becomes single crystal silicon, and the adjacent nMOS transistors 1 cannot be separated. For this reason, p-type impurity of high concentration is introduced by ion implantation or diffusion to the portions of the p-type silicon layer 12 formed over the buried insulating film 20 before field insulating film 13 is formed, so that p+ type separation layer 22 of p+ type single crystal silicon of high impurity concentration or p+ type polycrystal silicon is formed between the field insulating film 13 and the buried insulating film 20 and thus the adjacent nMOS transistors 1 can be sufficiently separated.

In the above described fourth embodiment, description was made only of a case corresponding to the first embodiment but it is the same with the cases corresponding to the second and third embodiments.

In the above described first to fourth embodiments, description was made of a case making use of the withdrawing effect of an electron due to diffusion current in a pn junction by applying a reverse bias voltage to a pn junction formed between the n-type silicon substrate 11 and the p-type layer. However, the present invention is applicable also to a case where a reverse bias voltage is not applied to the above described pn junction or to a case where simply p-type silicon layers 12 are epitaxially grown on the major surface of the p-type silicon substrate without utilizing the withdrawing effect due to the diffusion current in the pn junction.

In the foregoing, an example of an nMOS type solid-state image sensor was described. However, the present invention is not limited thereto and is also applicable to a pMOS type solid-state image sensor and a CCD type solid-state image sensor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A solid-state image sensor comprising:
a semiconductor substrate,
an epitaxial growth semiconductor layer formed on one major surface of said semiconductor substrate,
a photoelectric transducing portion including a plurality of photoelectric transducers provided horizontally in a plurality of rows and vertically in a plurality of columns at distances from each other on a surface of said epitaxial growth semiconductor layer,
a horizontal scanning circuit portion provided in the surface of said epitaxial growth semiconductor layer at a distance from said photoelectric transducing portion, in parallel with said photoelectric transducers in a horizontal direction, said horizontal scanning circuit portion scanning successively said photoelectric transducers in said plurality of columns,
a vertical scanning circuit portion provided in the surface of said epitaxial growth semiconductor layer at a distance from said photoelectric transducing portion, in parallel with said photoelectric transducers in a vertical direction, said vertical scanning circuit portion scanning successively said photoelectric transducers in said plurality of rows,
a field insulating film formed in the surface of said epitaxial growth semiconductor layer for separating said photoelectric transducers of said photoelectric transducing portion, said horizontal scanning circuit portion and said vertical scanning circuit portion, and
a buried insulating film provided between said field insulating film and said semiconductor substrate.

2. A solid-state image sensor in accordance with claim 1, wherein
said epitaxial growth semiconductor layer is formed so that said buried insulating film has a width less than 100 μm.

3. A solid-state image sensor in accordance with claim 1, wherein
a layer of high impurity concentration is formed between said field insulating film and said buried insulating film.

4. A solid-state image sensor in accordance with claim 1, wherein
said semiconductor substrate is of the first conduction type, a semiconductor layer of the second conduction type is formed on a major surface of said semiconductor substrate and said epitaxial growth semiconductor layer is of the second conduction type.

5. A solid-state image sensor in accordance with claim 4, wherein
a bias power supply is connected between said semiconductor substrate of the first conduction type and said semiconductor layer of the second conduction type.

6. A solid-state image sensor in accordance with claim 1, wherein
said photoelectric transducing portion comprises MOS transistors.

7. A solid-state image sensor in accordance with claim 1, wherein
independent regions in which elements independent of the operation of said photoelectric transducing portion, said horizontal scanning circuit portion and said vertical scanning circuit portion are formed are provided in peripheral portions outside said photoelectric transducing portion, said horizontal scanning circuit portion and said vertical scanning circuit portion in the surface of said epitaxial growth semiconductor layer.

8. A solid-state image sensor comprising:
a semiconductor substrate,
an epitaxial growth semiconductor layer formed on one major surface of said semiconductor substrate,
a photoelectric transducing portion including a plurality of photoelectric transducers provided horizontally in a plurality of rows and vertically in a plurality of columns at distances from each other on a surface of said epitaxial growth semiconductor layer,
a horizontal scanning circuit portion provided in the surface of said epitaxial growth semiconductor layer at a distance from said photoelectric transducing portion, in parallel with said photoelectric transducers in a horizontal direction, said horizontal scanning circuit portion scanning successively said photoelectric transducers in said plurality of columns,
a vertical scanning circuit portion provided in the surface of said epitaxial growth semiconductor layer at a distance from said photoelectric transducing portion, in parallel with said photoelectric transducers in a vertical direction, said vertical scanning circuit portion scanning successively said photoelectric transducers in said plurality of rows,
a field insulating film formed in the surface of said epitaxial growth semiconductor layer for separating said photoelectric transducers of said photoelectric transducing portion, said horizontal scanning circuit portion and said vertical scanning circuit portion, and
a buried insulating film provided between said semiconductor substrate and at least said field insulating film formed in the rows of said photoelectric transducers.

9. A solid-state image sensor in accordance with claim 8, wherein
said epitaxial growth semiconductor layer is formed so that said buried insulating film has a width less than 100 μm.

10. A solid-state image sensor in accordance with claim 8, wherein
a layer of high impurity concentration is formed between said field insulating film and said buried insulating film.

11. A solid-state image sensor in accordance with claim 8, wherein
said semiconductor substrate is of the first conduction type, a semiconductor layer of the second conduction type is formed on a major surface of said semiconductor substrate and said epitaxial growth semiconductor layer is of the second conduction type.

12. A solid-state image sensor in accordance with claim 11, wherein
a bias power supply is connected between said semiconductor substrate of the first conduction type and said semiconductor layer of the second conduction type.

13. A solid-state image sensor in accordance with claim 8, wherein
said photoelectric transducing portion comprises MOS transistors.

14. A solid-state image sensor in accordance with claim 8, wherein
independent regions in which elements independent of the operation of said photoelectric transducing portion, said horizontal scanning circuit portion and said vertical scanning circuit portion are formed are provided in peripheral portions outside said photoelectric transducing portion, said horizontal scanning circuit portion and said vertical scanning circuit portion in the surface of said epitaxial growth semiconductor layer.

15. A solid-state image sensor in accordance with claim 14, wherein
said semiconductor substrate is of the first conduction type,
said epitaxial growth semiconductor layer is of the second conduction type, and
portions in which a plurality of said photoelectric transducers in rows in said epitaxial growth semiconductor layer are formed are regions in a plurality of horizontal stripes joined with each other and separated between the adjacent rows by said buried insulating film, said regions being connected to said epitaxial growth semiconductor layer in said independent regions.

16. A solid-state image sensor in accordance with claim 14, wherein
said semiconductor substrate is of the first conduction type,
said epitaxial growth semiconductor layer is of the second conduction type, and
portions in which a plurality of said photoelectric transducers in columns of said epitaxial growth semiconductor layer are formed are regions in a plurality of vertical stripes joined with each other and separated between the adjacent columns by said buried insulating film, said regions being connected to said epitaxial growth semiconductor layer in said independent regions.

17. A solid-state image sensor as recited in claim 1 wherein said photoelectric transducers comprise nMOS transistors each having gate electrodes and source and drain regions.

18. In a solid-state image sensor including a semiconductor substrate, an epitaxial growth semiconductor layer formed on one major surface of said semiconductor substrate to provide source and drain regions, and gate electrode for controlling conductivity of transistors formed by said semiconductor layer, a photoelectric transducing portion including a plurality of photoelectric transducers provided horizontally in a plurality of rows and vertically in a plurality of columns at distances from each other on a surface of said epitaxial growth semiconductor layer, a horizontal scanning circuit portion provided in the surface of said epitaxial growth semiconductor layer at a distance from said photoelectric transducing portion, in parallel with said photoelectric transducers in a horizontal direction, said horizontal scanning circuit portion scanning succcessively said photoelectric transducers in said plurality of columns, a vertical scanning circuit portion provided in the surface of said epitaxial growth semiconductor layer at a distance from said photoelectric transducing portion, in parallel with said photoelectric transducers in a vertical direction, said vertical scanning circuit portion scanning successively said photoelectric transducers in said plurality of rows, the improvement comprising:
- a field insulating film formed in the surface of said epitaxial growth semiconductor layer for separating said photoelectric transducers of said photoelectric transducing portion, said horizontal scanning circuit portion and said vertical scanning circuit portion, and
- a buried insulating film provided between said field insulating film and said semiconductor substrate.

19. A solid-state image sensor comprising:
a semiconductor substrate,
an epitaxial growth semiconductor layer formed on one major surface of said semiconductor substrate,
a photoelectric transducing portion including a plurality of photoelectric transducer provided horizontally in a plurality of rows and vertically in a plurality of columns at distances from each other on a surface of said epitaxial growth semiconductor layer,
a horizontal scanning circuit portion provided in the surface of said epitaxial growth semiconductor layer at a distance from said photoelectric transducing portion, in parallel with said photoelectric transducers in a horizontal direction, said horizontal scanning circuit portion scanning successively said photoelectric transducers in said plurality of columns,
a vertical scanning circuit portion provided in the surface of said epitaxial growth semiconductor layer at a distance from said photoelectric transducing portion, in parallel with said photoelectric transducers in a vertical direction, said vertical scanning circuit portion scanning successively said photoelectric transducers in said plurality of rows,
a field insulating film formed in the surface of said epitaxial growth semiconductor layer for separating said photoelectric transducers of said photoelectric transducing portion, said horizontal scanning circuit portion and said vertical scanning circuit portion; and
a buried insulating film provided between said semiconductor substrate and at least said field insulating film formed in the columns of said photoelectric transducers.

20. A solid-state image sensor comprising:
a semiconductor substrate,
an epitaxial growth semiconductor layer formed on one major surface of said semiconductor substrate,
a photoelectric transducing portion including a plurality of photoelectric transducers provided horizontally in a plurality of rows and vertically in a plurality of columns at distances from each other on a surface of said epitaxial growth semiconductor layer,
a horizontal scanning circuit portion provided in the surface of said epitaxial growth semiconductor layer at a distance from said photoelectric transducing portion, in parallel with said photoelectric transducers in a horizontal direction, said horizontal scanning circuit portion scanning successively said photoelectric transducers in said plurality of columns,
a vertical scanning circuit portion provided in the surface of said epitaxial growth semiconductor layer at a distance from said photoelectric transducing portion, in parallel with said photoelectric transducers in a vertical direction, said vertical scanning circuit portion scanning successively said photoelectric transducers in said plurality of rows,
a field insulating film formed in the surface of said epitaxial growth semiconductor layer for separating said photoeletric transducers of said photoelectric transducing portion, said horizontal scanning circuit portion and said vertical scanning circuit portion, and
a buried insulating film provided between said semiconductor substrate and both said field insulating film formed in the rows of said photoelectric transducers and said field insulating film formed in the columns of said photoelectric transducers.

* * * * *